(12) United States Patent
Färm (10) Patent No.: US 11,749,523 B2
(45) Date of Patent: *Sep. 5, 2023

(54) METHODS FOR PREPARING SELF-ASSEMBLED MONOLAYERS

(71) Applicant: ASM IP HOLDING B.V., Almere (NL)

(72) Inventor: Elina Färm, Helsinki (FI)

(73) Assignee: ASM IP HOLDING B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/934,725

(22) Filed: Sep. 23, 2022

(65) Prior Publication Data

US 2023/0042093 A1 Feb. 9, 2023

Related U.S. Application Data

(60) Continuation of application No. 17/150,153, filed on Jan. 15, 2021, now Pat. No. 11,495,455, which is a division of application No. 16/033,485, filed on Jul. 12, 2018, now Pat. No. 10,937,645.

(60) Provisional application No. 62/532,515, filed on Jul. 14, 2017.

(51) Int. Cl.
| | |
|---|---|
| *H01L 21/02* | (2006.01) |
| *H01L 21/321* | (2006.01) |
| *B05D 1/00* | (2006.01) |
| *C23C 16/455* | (2006.01) |
| *H01L 21/3105* | (2006.01) |
| *C23C 16/04* | (2006.01) |
| *C23C 16/54* | (2006.01) |
| *C23C 16/46* | (2006.01) |
| *C23C 16/30* | (2006.01) |
| *H01L 21/67* | (2006.01) |
| *B05D 7/24* | (2006.01) |
| *H01L 21/32* | (2006.01) |

(52) U.S. Cl.
CPC .......... *H01L 21/02211* (2013.01); *B05D 1/62* (2013.01); *C23C 16/04* (2013.01); *C23C 16/30* (2013.01); *C23C 16/45523* (2013.01); *C23C 16/463* (2013.01); *C23C 16/54* (2013.01); *H01L 21/0228* (2013.01); *H01L 21/02271* (2013.01); *H01L 21/3105* (2013.01); *H01L 21/321* (2013.01); *B05D 7/24* (2013.01); *C23C 16/45525* (2013.01); *H01L 21/32* (2013.01); *H01L 21/67207* (2013.01)

(58) Field of Classification Search
CPC .. H01L 21/02211; H01L 21/0228; B05D 7/24
See application file for complete search history.

(56) References Cited

U.S. PATENT DOCUMENTS

| | | |
|---|---|---|
| 6,073,366 A | 6/2000 | Aswad |
| 7,118,779 B2 | 10/2006 | Verghese et al. |
| 7,914,847 B2 | 9/2011 | Verghese et al. |

(Continued)

FOREIGN PATENT DOCUMENTS

TW I394862 B 5/2013

*Primary Examiner* — Elizabeth A Burkhart
(74) *Attorney, Agent, or Firm* — Knobbe, Martens, Olson & Bear, LLP (57) ABSTRACT

The present application discloses forming self-assembled monolayers (SAMs) by exposing the substrate at least twice to SAM precursors with intervening cooling of a substrate.

20 Claims, 8 Drawing Sheets

(56) References Cited

U.S. PATENT DOCUMENTS

| | | | |
|---|---|---|---|
| 8,293,658 | B2 | 10/2012 | Shero et al. |
| 9,112,003 | B2 | 8/2015 | Haukka et al. |
| 9,803,277 | B1 | 10/2017 | Longrie et al. |
| 9,911,595 | B1 | 3/2018 | Smith et al. |
| 10,937,645 | B2 * | 3/2021 | Färm ............... H01L 21/02271 |
| 11,495,455 | B2 * | 11/2022 | Färm ............... H01L 21/3105 |
| 2007/0098894 | A1 | 5/2007 | Verghese et al. |
| 2011/0117702 | A1 | 5/2011 | Rietzler et al. |
| 2011/0123812 | A1 | 5/2011 | Reihs |
| 2011/0146703 | A1 | 6/2011 | Chen et al. |
| 2011/0198736 | A1 | 8/2011 | Shero et al. |
| 2013/0171348 | A1 | 7/2013 | Fang et al. |
| 2015/0194298 | A1 | 7/2015 | Lei et al. |
| 2015/0217330 | A1 | 8/2015 | Haukka et al. |
| 2015/0299848 | A1 | 10/2015 | Haukka et al. |
| 2016/0247695 | A1 | 8/2016 | Niskanen et al. |
| 2017/0256402 | A1 * | 9/2017 | Kaufman-Osborn ................ H01L 21/76826 |
| 2019/0019674 | A1 | 1/2019 | Färm |
| 2021/0134591 | A1 | 5/2021 | Färm |

* cited by examiner

METHODS FOR PREPARING SELF-ASSEMBLED MONOLAYERS

PRIORITY APPLICATIONS

The present application is a continuation of U.S. patent application Ser. No. 17/150,153, filed Jan. 15, 2021, which is a divisional of U.S. patent application Ser. No. 16/033,485, filed Jul. 12, 2018, now U.S. Pat. No. 10,937,645, which claims priority to U.S. Provisional Patent Application No. 62/532,515, filed Jul. 14, 2017.

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

FIELD

This application relates generally to the process of preparing a self-assembled monolayer.

BACKGROUND

Atomic layer deposition (ALD) is a known process in the semiconductor industry for forming thin films of materials on substrates, such as silicon wafers. ALD is a type of vapor deposition wherein a film is built up through self-saturating surface reactions performed in cycles. In an ALD process, gaseous precursors are supplied, alternatingly and repeatedly, to the substrate to form a thin film of material on the substrate. One reactant adsorbs in a self-limiting process on the wafer. A subsequent reactant pulse reacts with the adsorbed material to form a molecular layer of the desired material. The subsequent pulse can reduce or getter ligands from the adsorbed layer, can replace such ligands or otherwise add atoms (e.g., oxidize, nitridize, etc.). In a typical ALD reaction, no more than a molecular monolayer forms per cycle. Cycles can be more complex and involve three or more reactants in sequence. Some recognized advantages of ALD are low temperature processing and near perfect conformality, leading to great interest in ALD for semiconductor processing.

Other processes besides ALD exist for forming thin films of materials on substrates. One such process is chemical vapor deposition (CVD), in which a substrate is exposed to one or more volatile precursors which react and/or decompose on the substrate to form a thin film. Unlike pure ALD, mutually reactive reactants are often simultaneously exposed to the substrate in CVD. Hybrid ALD/CVD processes can allow some overlap of precursors to obtain some of the conformality advantages of ALD and some of the speed advantages of CVD. Both ALD and CVD can be sensitive to the exposed surface; depending upon the precursors and deposition conditions, vapor deposition processes can nucleate well or poorly on different surfaces.

Invariably, during processing, deposition occurs on exposed surfaces other than those for which deposition may be desired. For example, a film buildup can occur on exposed surfaces of a reactor as multiple substrates are processed in sequence. The film buildup can delaminate or flake from the reactor surfaces and contaminate the substrate surface. Large amounts of loosely adhered film buildup on the reactor surfaces also increases the total surface area exposed to a reactant pulse, thereby increasing the pulse and purge time required to saturate substrate surfaces. In addition, films can be deposited on undesirable areas of semiconductor device structures, such as dielectric surfaces, entailing additional patterning and etch steps.

Currently, selective processes are available that prevent or reduce the amount of unwanted film deposition on reactor surfaces and device structures. Some such processes utilize a treatment process that results in a protective self-assembled monolayer (SAM) over reactor surfaces such as those described in U.S. Pat. Nos. 7,914,847; 8,293,658; and 9,803,277, the disclosures of which are incorporated by reference herein in their entireties for all purposes. Other processes utilize a passivation process that deactivates some surfaces and enables a selective deposition on unpassivated substrate surfaces, such as those described in U.S. Pat. No. 8,293,658, incorporated above, and U.S. Patent Publications No. 2016-0247695 A1, 2015-0299848 A1, 2015-0217330 A1, and U.S. Pat. No. 9,112,003, the disclosures of which are incorporated by reference herein in their entireties for all purposes.

Creating a SAM from the vapor phase, as opposed to a liquid phase, is advantageous for many reasons, including the ability to use of the same or similar type of apparatus as used in ALD and CVD. Organosilane based SAMs may be created through vapor phase processes, but such a SAM typically employs multiple and prolonged exposures in order to create a desired organosilane SAM.

SUMMARY

In one aspect a self-assembled monolayer (SAM) preparation process on an exposed surface of a substrate is provided. The method includes supplying a first SAM precursor to adsorb an initial SAM over an exposed surface of the substrate. The method further includes cooling the substrate with the initial SAM. The method further includes supplying a second SAM precursor to the initial SAM after the cooling to produce a supplemented SAM over the exposed surface of the substrate.

In some embodiments, the SAM preparation process further includes supplying the first SAM precursor in the vapor phase. In some embodiments, the process includes supplying the first SAM precursor at a temperature of about 80° C. to about 400° C.

In some embodiments, the first SAM precursor is a silane. In some embodiments, the silane is octadecyl(tris(dimethyl)amino)silane.

In some embodiments, the substrate is at a temperature within the range of about 80° C. to about 400° C. during supplying the first SAM precursor. In some embodiments, the process further includes exposing the exposed surface of the substrate to H$_2$O prior to supplying the first SAM precursor. In some embodiments, exposing the exposed surface of the substrate to H$_2$O is performed for about 0.25 seconds to about 5 seconds. In some embodiments, supplying the first SAM precursor includes supplying for about 0.5 second to about 30 seconds. In some embodiments, the first SAM precursor is supplied at a rate of about 50 sccm to about 1600 sccm in a single substrate semiconductor process chamber. In some embodiments, the process further includes soaking the exposed surface of the substrate for about 0.5 minute to about 15 minutes after the first SAM precursor is supplied but before cooling the substrate.

In some embodiments, cooling includes supplying a vapor to the substrate, wherein the vapor is lower in temperature relative to the temperature of the substrate. In some embodiments, the process includes wherein the vapor is ambient atmosphere. In some embodiments, the process includes wherein the vapor is an inert gas. In some embodiments, the process includes wherein the vapor is nitrogen gas. In some embodiments, the process includes wherein cooling includes bringing the substrate to about 15° C. to about 30° C. In some embodiments, cooling the substrate is conducted for about 1 minutes to about 60 minutes. In some embodiments, cooling the substrate is conducted for about 6 hours to about 24 hours.

In some embodiments, the first SAM precursor is supplied in a first deposition chamber. In some embodiments, cooling is performed inside the first deposition chamber. In some embodiments, cooling is performed outside the first deposition chamber. In some embodiments, cooling is performed at a cooling station. In some embodiments, the process further includes, after supply the second SAM precursor, placing the substrate into a second deposition chamber different from the first deposition chamber and depositing a layer by vapor deposition selectively on an adjacent surface of the substrate relative to the supplemented SAM.

In some embodiments, the second SAM precursor is used to adsorb onto reactive sites of the initial SAM on which the first SAM precursor is not adsorbed to form the supplemented SAM. In some embodiments, the process further includes vaporizing the second SAM precursor. In some embodiments, the second SAM precursor is vaporized at a temperature of about 80° C. to about 400° C.

In some embodiments, the second SAM precursor is a silane. In some embodiments, the silane is octadecyl(tris(dimethyl)amino)silane. In some embodiments, the first SAM precursor and the second SAM precursor have the same composition. In some embodiments, the first SAM precursor and the second SAM precursor have different compositions.

In some embodiments, the process further includes re-heating the substrate to a temperature of about 80° C. to about 400° C. between cooling and supplying the second SAM precursor. In some embodiments, the process further includes exposing the exposed surface of the substrate to $H_2O$ after the substrate is re-heated but before the second precursor is supplied. In some embodiments, exposing the exposed surface of the substrate to $H_2O$ is performed for about 0.25 seconds to about 5 seconds.

In some embodiments, the second SAM precursor is supplied in the vapor phase. In some embodiments, the second SAM precursor is supplied at a temperature of about 80° C. to about 400° C. In some embodiments, the second SAM precursor is vaporized at about the same temperature as the substrate during supplying the second SAM precursor. In some embodiments, the second SAM precursor is supplied for about 0.5 second to about 30 seconds. In some embodiments, the second SAM precursor is supplied at a rate of about 50 sccm to about 1600 sccm in a single substrate semiconductor process chamber. In some embodiments, the process further includes soaking the exposed surface of the substrate for about 0.5 minute to about 15 minutes after the second precursor is supplied.

In some embodiments, the initial SAM produces a water contact angle of at most 108°. In some embodiments, the supplemented SAM produces a water contact angle of greater than 108°. In some embodiments, the supplemented SAM produces a water contact angle of at least 110°. In some embodiments, the supplemented SAM produces a water contact angle of between 110° to 111°. In some embodiments, the supplemented SAM is pin-hole free.

In some embodiments, the exposed surface is a surface of a reaction chamber. In some embodiments, the process further includes vapor depositing a layer on a semiconductor substrate surface within the reaction chamber selectively relative to over the supplemented SAM on the reaction chamber surface. In some embodiments, the substrate is a surface of a patterned semiconductor substrate. In some embodiments, the process further includes depositing a layer on a surface of the substrate adjacent the supplemented SAM selectively relative to over the supplemented SAM. In some embodiments, the exposed surface is a first exposed surface of an insulating surface of an integrated circuit structure. In some embodiments, the integrated circuit structure comprises the first exposed surface and a second exposed surface. In some embodiments, the initial SAM and supplemented SAM do not form over the second exposed surface.

In some embodiments, the process further includes one or more additional cycles of cooling and exposure to a third SAM precursor.

In another aspect an apparatus for depositing a self-assembled monolayer (SAM) on a surface of a substrate is provided. The apparatus includes at least one SAM source configured for supplying at least one SAM precursor vapor. The apparatus further includes a reaction chamber configured to accommodate a substrate on a susceptor and in fluid communication with the at least one SAM source. The apparatus further includes a control system. The apparatus further includes a control system configured to deposit an initial SAM over a surface of the substrate by communicating a first SAM precursor vapor from the at least one SAM source. The control system is further configured to cool the substrate after depositing the initial SAM. The control system is further configured to form a supplemented SAM over the surface of the substrate by communicating a second SAM precursor vapor from the at least one SAM source to the initial SAM after cooling the substrate.

In some embodiments, the apparatus for depositing a SAM further includes a cooling station configured to accommodate the substrate. In some embodiments, the cooling station is outside the reaction chamber, wherein the control system is configured to transfer the substrate to the cooling station between depositing the initial SAM and forming the supplemented SAM. In some embodiments, the apparatus further includes a transfer chamber and a load-lock chamber, and the cooling station is formed in one of the transfer chamber and the load-lock chamber.

In some embodiments, the control system is configured to cool the substrate to about 15° C. to about 30° C. In some embodiments, the control system is configured to heat the substrate to about 80° C. to about 400° C.

DETAILED DESCRIPTION

As noted in the Background section, processes exist to deactivate particular surfaces (e.g., reactor surfaces and surfaces of partially fabricated integrated circuit structures) against vapor deposition such as ALD to allow selective deposition on untreated surfaces. One such process involves forming a densely-packed, self-assembled monolayer (SAM) over exposed surfaces on which film deposition is not desired. A SAM is a relatively ordered assembly of molecules that spontaneously adsorb (also called chemisorb) from either vapor or liquid phase precursors on a surface. A typical SAM molecule includes a terminal functional group, a hydro-carbon chain and a head group. By forming a SAM over selected surfaces, the SAM can prevent film growth over the exposed surfaces using certain types of vapor precursors by blocking reactive sites on the exposed surface that would otherwise react with those deposition precursors. Such selective deactivation can be particularly effective against adsorption-driven processes, like ALD, but can also discourage certain types of CVD.

Organosilane Based SAM

The present application discloses apparatuses and processes for vapor based deposition of organosilane based SAMs that can be formed with fewer exposures and/or take less time in order to create a desired organosilane SAM through the use of intermediate cooling of a substrate exposed to a SAM precursor prior to a subsequent exposure to a SAM precursor. It is believed that intermediate cooling allows a second SAM precursor exposure to adsorb onto reactive sites where the first SAM precursor has not adsorbed. In some embodiments, the process of intermediate cooling and a second SAM precursor exposure creates a SAM layer that is dense and pin-hole free, such that it can resist nucleation even after prolonged exposure to a subsequent selective deposition that forms a relatively thick layer on other surfaces without the SAM.

SAM precursors may include any known to a person of ordinary skill in the art, such as thio-based and organosilane based SAM precursors. In some embodiments, SAM precursors are identified in U.S. Pat. No. 7,914,847, the disclosure of which is herein incorporated by reference in its entirety. The SAM precursor molecule may contain alkyl chain substituent of various carbon chain lengths. Organosilane based SAM precursors may include, for example, octadecyl(tris(dimethyl)amino)silane, as shown below.

SAM precursors are generally of the formula R—Si-L₃, wherein the L groups correspond to active groups and the R group may be a carbon chain or carbon backbone. In some embodiments, the active groups may be an alkylamino group (e.g., —NMe₂, -NEtMe, -NEt₂), an alkoxy group (e.g., -OMe, -OEt), or mixtures thereof. In some embodiments, the active groups may be any other group which can be bound to the surface of a substrate. In some embodiments, the SAMs may contain the carbon chain length or backbone length of 1, 2, 3, 5, 10, 15, 18, 20, 25 or 30 carbon atoms, or any range between any of these values such as, for example, 1 to 25, 2 to 20 or 3 to 18 carbon atoms. In some embodiments, the carbon chain may be an alkyl chain. In some embodiments, the carbon chain may be unsubstituted. In some embodiments, the carbon chain may be substituted. The term substituted is understood to mean that groups or atoms along the chain are substituted by one or more substituents. For example, a substituted alkyl chain may have one or more of the hydrogen atoms at any position(s) along the carbon chain replaced with a substituent such as fluorine, wherein positions along the carbon chain include the terminal ends of the carbon chain as well as positions between the terminal ends. In some embodiments, the carbon chain substituent groups may provide increased hydrophobicity of the SAM layer and/or an increased water contact angle measurement. In some embodiments, the carbon chain may be substituted by one or more fluorine groups.

Water Contact Angle

The completeness of a SAM formed over an exposed surface can be characterized by the measured water contact angle (WCA) of the surface. In some embodiments, a SAM formed conventionally using particular precursor(s) has a WCA of at most about 108°. In some embodiments, a SAM formed using the same precursor(s) but with intervening cooling has an increased WCA, such as a WCA of an exposed surface is greater than 108°. In other embodiments, a SAM formed with intervening cooling has the WCA of greater than about 80°, greater than about 90°, greater than about 95°, greater than about 100°, greater than about 103°, greater than about 106°, greater than about 108°, greater than about 109°, greater than about 110°, greater than about 111°, greater than about 112° or greater than about 113°, or any range between any of these values such as, for example, about 80° to about 113°, about 90° to about 111°, about 108° to about 113° or about 110° to about 111°.

Deposition Equipment

Some embodiments of apparatuses and processes are described below for vapor based deposition of an organosilane based SAMs and selective vapor deposition.

Figure 1:
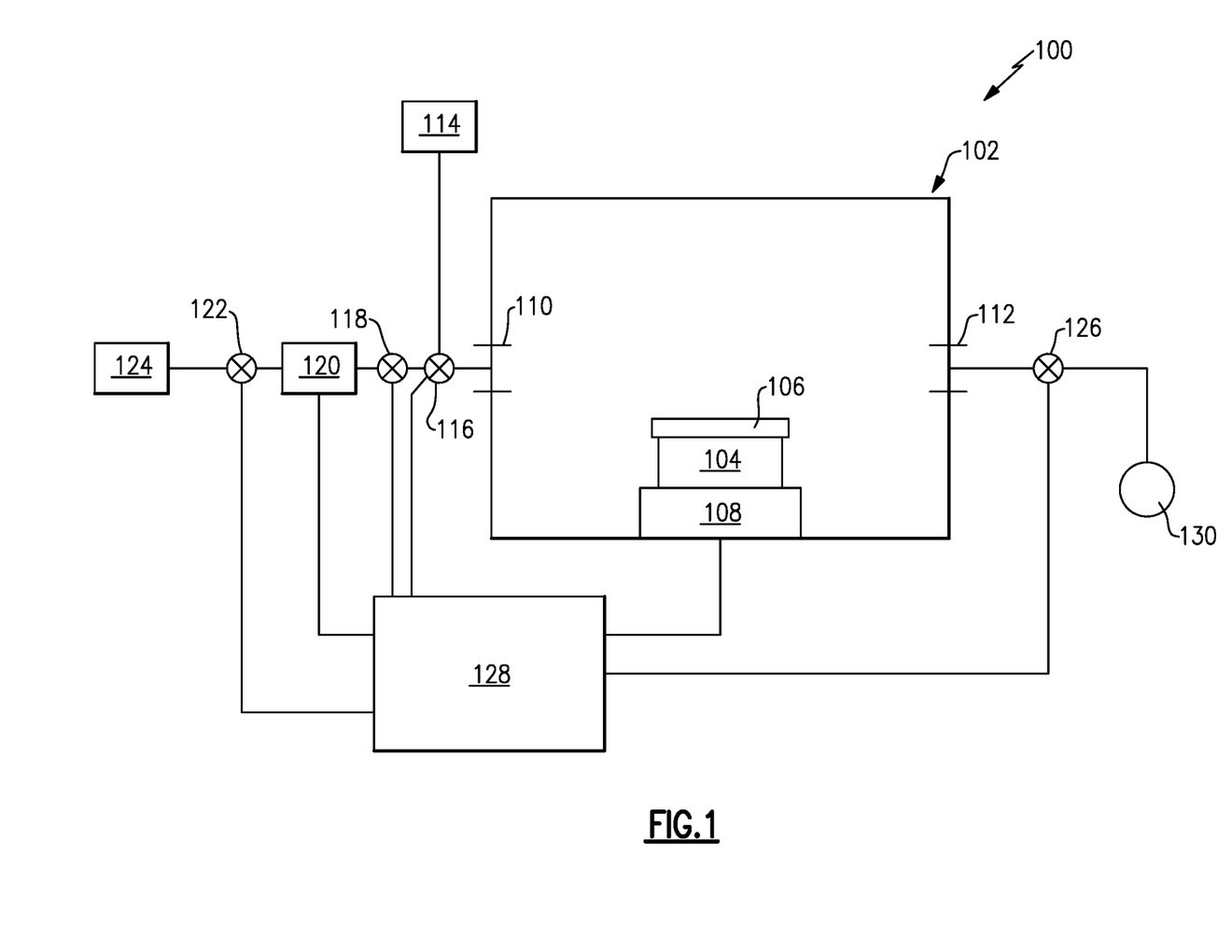
FIG. 1 schematically illustrates an apparatus comprising a reaction chamber according to some embodiments.

FIG. 1 illustrates an apparatus 100 comprising a reaction chamber 102 and its features after a substrate 104 has been introduced to the reaction chamber 102 according to some embodiments. The reaction chamber 102 can be a CVD reaction chamber, an ALD reaction chamber, a chamber specially designed for SAM formation, or any other type of reaction chamber capable of vapor deposition on substrate(s) such as silicon wafers. The reaction chamber 102 can be either a single-substrate processor or a multi-substrate processor. The substrate 104 can include an exposed surface 106, which can be patterned to include, for example, exposed insulating and conductive surfaces. The reaction chamber 102 can include a susceptor 108, an inlet port 110, an outlet port 112, deposition reactant source(s) 114 (which may include vaporizer(s) for low vapor pressure reactants), a reactant source valve 116, a first valve 118, a passivation precursor source 120 (which may also include a vaporizer), a second valve 122, a carrier gas source 124, and an outlet valve 126. The outlet valve 126 may be in fluid communication with a vacuum pump 130. The various components may be electronically coupled to a controller (or set of controllers) 128. One skilled in the art will appreciate that the apparatus 100 is shown schematically only and can take on a variety of other configurations and include other components such as heaters, containers, evaporators or bubblers for various other reactants, control systems for temperature control, control of flow for the deposition precursors, gas distribution system, etc.

In some embodiments, the SAM precursor is vaporized in the passivation precursor source 120. In some embodiments, the vapor source is at a temperature of about 20° C., about 40° C., about 50° C., about 70° C., about 90° C., about 100° C., about 150° C., about 200° C., about 225° C., about 250° C., about 300° C., about 400° C., or any range between any of these values such as, for example, about 20° C. to about 300° C., 40° C. to about 250° C., 50° C. to about 225° C., 20° C. to about 400° C., or about 80° C. to about 400° C. In other embodiments, the vapor source is at a temperature of about 150° C. to about 400° C. In still other embodiments, the vapor source is at a temperature of about 200° C. to about 400° C. In yet still other embodiments, the vapor source is at a temperature of about 150° C. to about 300° C. The skilled artisan will appreciate that a suitable temperature for vaporizing without thermally decomposing the SAM precursor will depend upon the selected precursor. In some embodiment, SAM formation may be conducted with vaporizer and susceptor temperatures each individually set to about 20° C., about 50° C., about 100° C., about 150° C., about 185° C., about 195° C., about 200° C., about 205° C., about 250° C., about 300° C., about 350° C., about 400° C., about 195° C., or any range between any of these values such as, for example, about 20° C. to about 400° C., about 50° C. to about 300° C., about 50° C. to about 250° C., about 100° C. to about 200° C., or about 185° C. to about 205° C. Experiments described below for SAM formation by exposure to octadecyl(tris(dimethyl)amino)silane were conducted with both vaporizer and susceptor temperatures set to between 185° C. and 205° C., more particularly about 195° C.

The susceptor 108 may be used to conductively heat, cool or re-heat the substrate. In some embodiments, the controls are programmed to maintain the susceptor 108 at a temperature suitable for adsorption of the SAM of interest, which may be similar to the ranges noted above for precursor vaporization. In some embodiments the controls may also be programmed to cool the susceptor 108 in accordance with the sequences described below.

While illustrated with a substrate 104 on the susceptor 108, it will be understood in view of the disclosure below that, in some embodiments, the substrate on which the passivation layer is formed may be the walls of the reaction chamber 102 itself, such that the substrate 104 on which subsequent deposition on unpassivated surfaces is desired may be absent from the chamber 102 during the formation of the passivation layer.

While FIG. 1 shows separate reactant source(s) 114, in some embodiments the apparatus 100 is a dedicated SAM exposure reactor, such that the reaction chamber 102 is not connected to vapor sources other than the SAM precursor molecules in the passivation precursor source 120 and inert gas, such as $N_2$, He or Ar in the carrier gas source 124.

Figure 2:
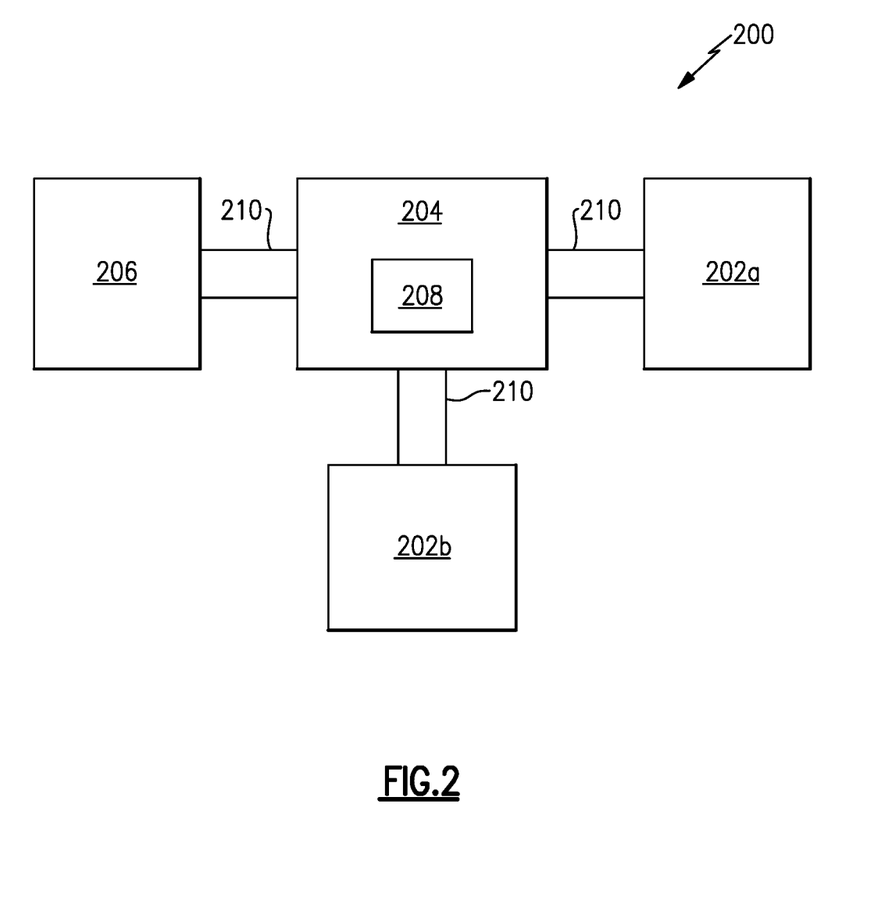
FIG. 2 is a schematic plan view of a cluster tool comprising a reaction chamber, a transfer chamber, and a load-lock chamber according to some embodiments.

FIG. 2 is a schematic plan view of a cluster tool 200 comprising a first process chamber 202a, a second process chamber 202b, a transfer chamber 204, and a load-lock chamber 206 according to some embodiments. The chambers have gate valves 210 between them, and the transfer chamber 204 may include a transfer robot. In some embodiments, the transfer chamber 204 may comprise a cooling station 208. One skilled in the art will appreciate that the cluster tool 200 is shown schematically only and can take on a variety of other configurations and include additional or other components such as additional process chamber(s) 202, heaters, evaporators or bubblers, control systems for temperature control, control of flow for the deposition precursors, gas distribution system, etc.

In some embodiments, the cluster tool may comprise multiple reaction chambers, transfer chambers, and load-lock chambers. In some embodiments, the cluster tool environment may not comprise a transfer chamber. In some embodiments, cooling as described below may be performed in the reaction chamber. In other embodiments, cooling may be performed in the transfer chamber at the cooling station. In still other embodiments, cooling may be performed in the load-lock chamber. In still other embodiments, cooling may be performed outside the cluster tool. In yet still other embodiments, cooling may be performed in any other dedicated cooling chamber or station in the cluster tool environment. In some embodiments, cooling may be actively performed, such as convectively using air or inert gas (such as nitrogen, helium, argon, or mixtures thereof), or conductively by moving colder elements into proximity or contact with the substrate or susceptor. In embodiments employing convective cooling stations, the cooling station may be plumbed only with inert gases, without connection to reactive gases. In some embodiments, cooling may be conducted passively by removing the substrate from a heat source but without active cooling. In some embodiments, substrates may be stored in the cooling chamber or station before deposition of the SAM on the substrates. In some embodiments, the cooling chamber or station may be configured to hold one substrate or may be configured to hold more than one substrate. In some embodiments, the cooling chamber or station may be configured to hold 1 or more substrates, 2 or more substrates, 3 or more substrates, 5 or more substrates, 10 or more substrates, 15 or more substrates or 25 or more substrates, or any range between any of these values.

Process Flow

Figure 3:
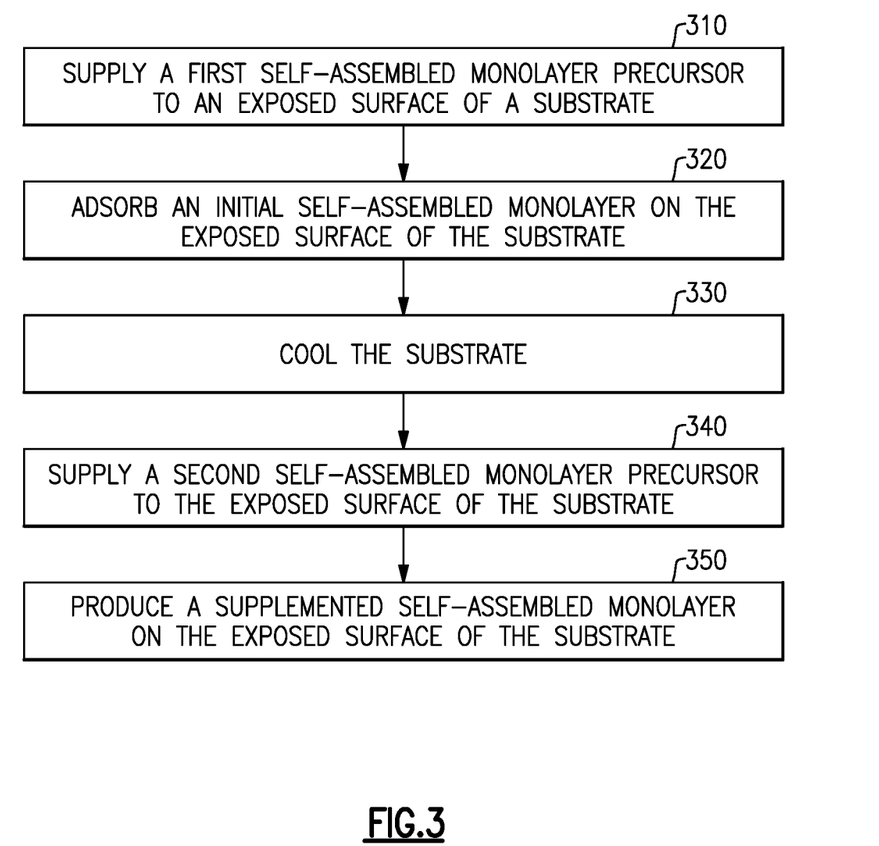
FIG. 3 is a flow chart of a process for preparing a SAM on an exposed surface of a substrate according to some embodiments.

FIG. 3 is a flow chart of a process for preparing a SAM on a surface of a substrate according to some embodiments. The process comprises supplying 310 a first SAM precursor to an exposed surface of a substrate; thereby adsorbing 320 an initial SAM on the exposed surface of the substrate; cooling 330 the substrate after adsorbing 320 the initial SAM; supplying 340 a second SAM precursor to the exposed surface of the substrate after cooling 330; thereby producing 350 a supplemented SAM on the exposed surface of the substrate.

In some embodiments, supplying a first SAM precursor may comprise a SAM precursor exposure pulse of about 0.1 second to about 30 minutes. In other embodiments, supplying a first SAM precursor may comprise a SAM precursor exposure pulse of about 0.5 seconds to about 30 seconds. In still other embodiments, supplying a first SAM precursor may comprise a SAM precursor exposure pulse of about 1 second to about 10 seconds. In some embodiments, supplying a first SAM precursor may additionally comprise a SAM precursor soak of about 10 seconds to about 30 minutes, wherein an exposure soak comprises continued exposure of the substrate to the SAM precursor, and may include sealing the outlets of the process chamber to trap the SAM precursor in the process chamber. In other embodiments, supplying a first SAM precursor may additionally comprise a SAM precursor soak of about 0.5 minute to about 15 minutes. In still other embodiments, supplying a first SAM precursor may comprise a SAM precursor exposure soak of about 1 minute to about 10 minutes. The flow rate will depend on SAM formation condition and the size of the chamber. For a single-substrate process chamber for a 300-mm wafer, for example, supplying a first SAM precursor may comprise a SAM precursor flow rate of about 50 sccm to about 1600 sccm. In experiments described below, supplying the first SAM precursor comprised a SAM precursor flow rate of about 800 sccm for about 5 seconds followed by a 5 min. soak.

In some embodiments, cooling may be performed convectively using air or ambient atmosphere. In other embodiments, cooling may be performed convectively using an inert gas, for example nitrogen gas. In still other embodiments, cooling may be performed conductively by actively cooling the susceptor 108 or other support for the substrate 104. In still other embodiments, cooling may be performed passively by removing the substrate from the heat source used during passivation precursor exposure, and may involve placing the substrate on a station or merely holding the substrate with a transfer robot until sufficiently cooled. In some embodiments, cooling may be performed for about 1 second, about 5 seconds, about 10 seconds, about 60 seconds, about 300 seconds, about 600 seconds, about 1 minute, about 1 minute, about 5 minute, about 5 minute, about 15 minute, about 30 minute, about 60 minute or about 24 hours, or any range between any of these values such as, for example, about 1 second to about 600 seconds, about 5 seconds to about 300 seconds, about 10 seconds to about 60 seconds, about 1 minute to about 30 minutes or about 1 minute to about 15 minutes. In some embodiments, cooling may be performed for less than 10 seconds, less than 30 seconds, less than 60 seconds, less than 5 minutes, less than 10 minutes, less than 15 minutes, less than 30 minutes or less than 60 minutes. In some embodiments, cooling may be performed for about 1 minute to about 60 minutes. In some embodiments, cooling may be performed for about 6 hours to about 24 hours. Blast cooling or quick cooling may refer to cooling times of about 60 seconds or less. Normal cooling may refer to cooling times of about 60 seconds or more, such as about 1 minute to about 30 minutes.

In some embodiments, cooling is performed to less than or at about 100° C., less than or at about 75° C., less than or at about 50° C., less than or at about 30° C., less than or at about 25° C., less than or at about 20° C., less than or at about 15° C. In some embodiments, cooling is performed to about 0° C. to about 50° C. In some embodiments, cooling is performed to about 15° C. to about 30° C. In still other embodiments, cooling is performed to about 20° C. to about 25° C. In yet still other embodiments, cooling is performed to about 20° C. or room temperature. In some embodiments employing active or blast cooling, the final cooling temperature may be below freezing at about 0° C. or less, at about −10° C. or less, at about −25° C. or less, at about −50° C. or less, at about −80° C. or less, at about −100° C. or less, or at about −200° C. or less, or any range between any of these values. In some embodiments, cooling is performed to a final temperature that is below the SAM formation temperature. In some embodiments, cooling is performed to a temperature below the SAM formation temperature by about 50° C. or more, by about 100° C. or more, by about 125° C. or more, by about 150° C. or more or vy about 175° C. or more, or any range between any of these values. In some embodiments, cooling is performed to about 75% less than the SAM formation temperature (as measured in Celsius), about 50% less than the SAM formation temperature, about 35% less than the SAM formation temperature, about 20% less than the SAM formation temperature, about 15% less than or about 10% less than the SAM formation temperature, or any range between any of these values.

In some embodiments, cooling to a desired temperature may be performed in one step. In some embodiments, cooling to a desired temperature may be performed in more than one steps, wherein a substrate may be cooled to one or more intermediate temperatures and then subsequently cooled to a final desired temperature. In some embodiments, the one or more intermediate cooling steps may perform the cooling an intermediate temperature that is below the SAM formation temperature. In some embodiments, the intermediate cooling temperatures are below the SAM formation temperature by about 20° C. or more, by about 50° C. or more, by about 75° C. or more or by about 100° C. or more, or any range between any of these values. In some embodiments, the intermediate cooling temperatures are about 15% less than the SAM formation temperature (as measured in Celsius), about 25% less than the SAM formation temperature, about 30% less than the SAM formation temperature, about 40% less than the SAM formation temperature, about 50% less than the SAM formation temperature, about 60% less than the SAM formation temperature, about 70% less than the SAM formation temperature, about 80% less than the SAM formation temperature, about 90% less than the SAM formation temperature, or any range between any of these values such as, for example, 15% to 90%, 25% to 70% or 30% to 60%.

In some embodiments, supplying a second SAM precursor may comprise exposing the substrate to a SAM precursor for about 0.1 second to about 30 minutes. In other embodiments, supplying a second SAM precursor may comprise exposing the substrate to a SAM precursor for about 0.5 second to about 20 seconds. In still other embodiments, supplying a second SAM precursor may comprise a SAM precursor exposure of about 1 second to about 10 seconds. In some embodiments, supplying a second SAM precursor may additionally comprise a SAM precursor soak of about 10 seconds to about 30 minutes, wherein a soak comprises continued exposure of the substrate to the SAM precursor, and may include sealing the outlets of the process chamber to trap the SAM precursor in the process chamber. In other embodiments, supplying a second SAM precursor may comprise a SAM precursor soak of about 0.5 minute to about 15 minutes. In still other embodiments, supplying a second SAM precursor may comprise a SAM precursor soak of about 1 minute to about 10 minutes. The flow rate will depend on SAM formation condition and the size of the chamber. For a single-substrate process chamber for a 300-mm wafer, for example, supplying a second SAM precursor may comprise a SAM precursor flow rate of about 50 sccm to about 1600 sccm. In experiments described below, supplying the second SAM precursor comprised a SAM precursor flow rate of about 800 sccm for about 5 seconds followed by a 5 min. soak.

In some embodiments, the process for preparing a SAM on a surface of a substrate comprises one or more additional cycles of cooling and exposure to a third SAM precursor. In some embodiments, an additional cycle of cooling and exposure to a third SAM precursor may be performed subsequent to cooling 330 and prior to supplying 340 a second SAM precursor. In some embodiments, an additional cycle of cooling and exposure to a third SAM precursor may be performed subsequent to supplying 340 a second SAM precursor. In some embodiments, the third SAM precursor may comprise the first SAM precursor, the second SAM precursor, a SAM precursor different from the first or second SAM precursor, or mixtures thereof.

It will be understood by a person of ordinary skill in the art that the first and second SAM precursor exposures may be performed independently at any vapor source temperature described throughout the specification. It will be understood by a person of ordinary skill in the art that the first and second SAM precursors may have the same compositions. In experiments described below, both the first and second SAM precursors comprise octadecyl(tris(dimethyl)amino) silane. The first and second precursor exposures can be performed in different process chambers but will more often be conducted in the same process chamber, particularly when employing the same precursor for both exposures. The process chamber may be the same or different from one employed for a subsequent selective ALD process.

It will also be understood by a person of ordinary skill in the art that the first and second SAM precursors may have different compositions. In one embodiment, the first SAM precursor may be a long-chain molecule while the second SAM precursor may be a short-chain molecule. In another embodiment, the first SAM precursor may be a short-chain molecule while the second SAM precursor may be a long-chain molecule. In some embodiments, the number of carbon atoms is greater than or equal to eight for long-chain molecules, while less than eight for short-chain molecules. In other embodiments, the number of carbon atoms is greater than or equal to twelve for long-chain molecules. In other embodiments, the number of carbon atoms is less than or equal to six for short-chain molecules. SAM precursors with different compositions are disclosed in U.S. Pat. Nos. 7,914,847 and 8,293,658, the entire disclosures of which are incorporated herein by references for all purposes.

Figure 4:
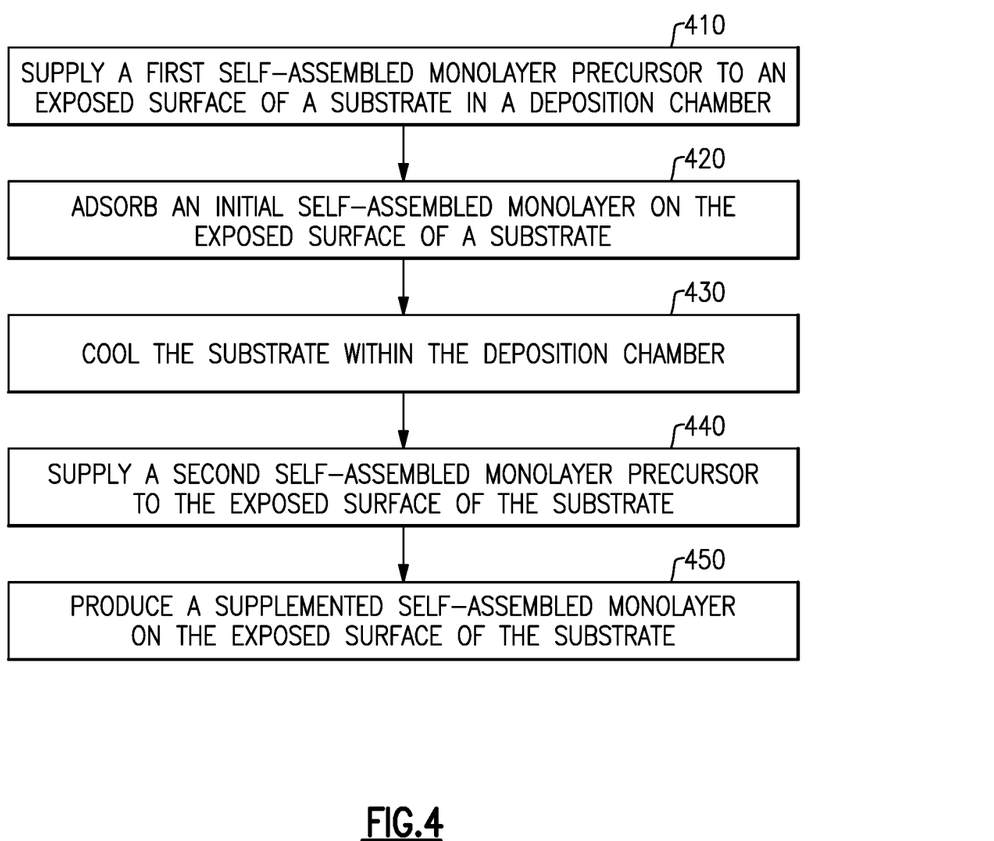
FIG. 4 is a flow chart of a process for preparing a SAM on an exposed surface of a substrate with cooling the substrate within a deposition chamber according to some embodiments.

FIG. 4 is a flow chart of a process for preparing a SAM on an exposed surface of a substrate including intervening cooling of the substrate within a deposition chamber according to some embodiments. The process comprises supplying 410 a first SAM precursor to an exposed surface of a substrate in a deposition chamber; thereby adsorbing 420 an initial SAM on the exposed surface of the substrate; subsequently cooling 430 the substrate within the deposition chamber; subsequently supplying 440 a second SAM precursor to the exposed surface of the substrate; thereby producing 450 a supplemented SAM on the exposed surface of the substrate. The process described in FIG. 4 is similar to the process described with respect to FIG. 3 except that cooling of the substrate is specified to be performed within the deposition chamber. Methods of cooling the substrate within the deposition chamber may be as described above (e.g., convectively cooling by supply of cool air or inert gas, active conductive cooling of the susceptor in the process chamber, etc.).

Figure 5:
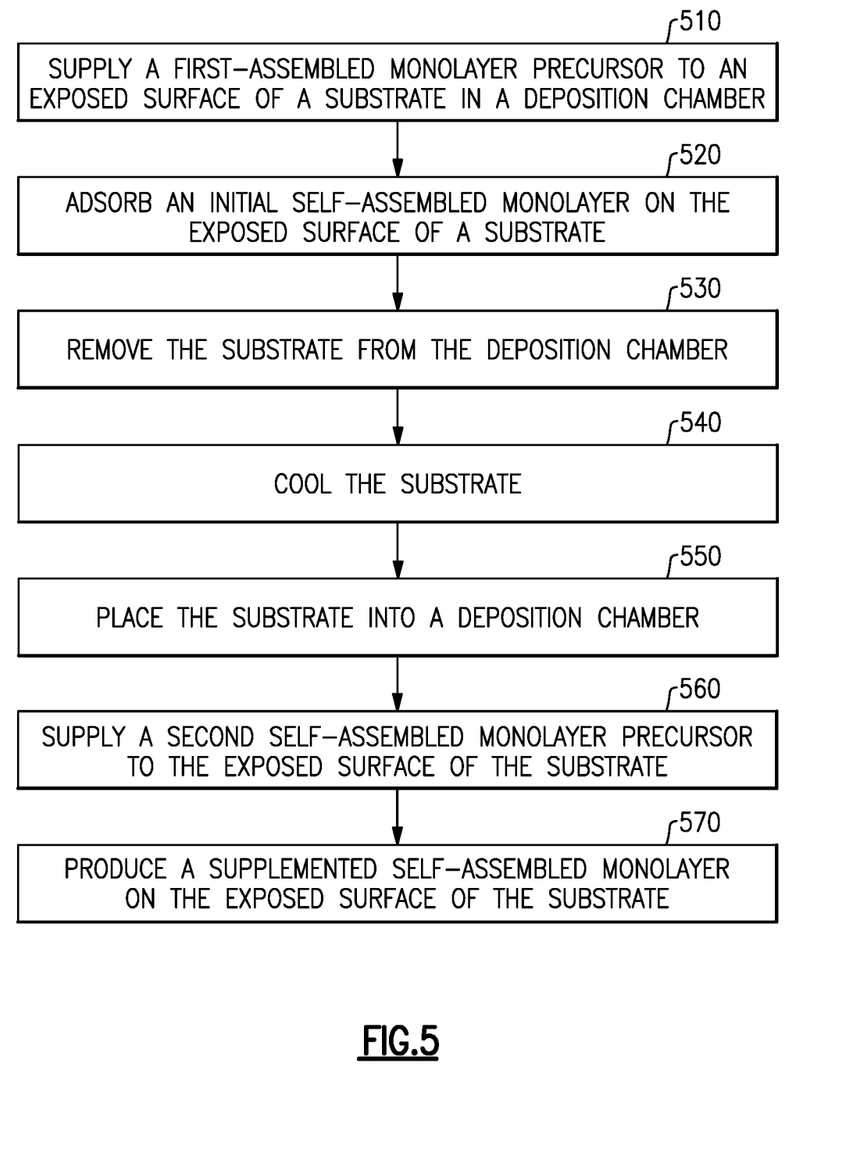
FIG. 5 is a flow chart of a process for preparing a SAM on an exposed surface of a substrate with cooling the substrate outside a deposition chamber according to some embodiments.

FIG. 5 is a flow chart of a process for preparing a SAM on an exposed surface of a substrate with cooling the substrate outside a deposition chamber according to some embodiments. The process comprises supplying 510 a first SAM precursor to an exposed surface of a substrate in a deposition chamber; thereby adsorbing 520 an initial SAM on the exposed surface of the substrate; removing 530 the substrate from the deposition chamber; cooling 540 the substrate; placing 550 the substrate into a deposition chamber; supplying 560 a second SAM precursor to the exposed surface of the substrate; thereby producing 570 a supplemented SAM on the exposed surface of the substrate. In some embodiments, the first and second precursors are the same type of precursor. In some embodiments, both precursors are supplied in the same deposition chamber. The process described in FIG. 5 is similar to the process described with respect to FIG. 3 except that cooling of the substrate is specified to be performed outside the deposition chamber. Methods of cooling the substrate outside the deposition chamber may be similar to those described above (e.g., passive cooling, convective cooling, conductive cooling by contact or close proximity with an actively cooled element), and may be conducted in a load-lock chamber, a transfer chamber, or another process chamber.

Figure 6:
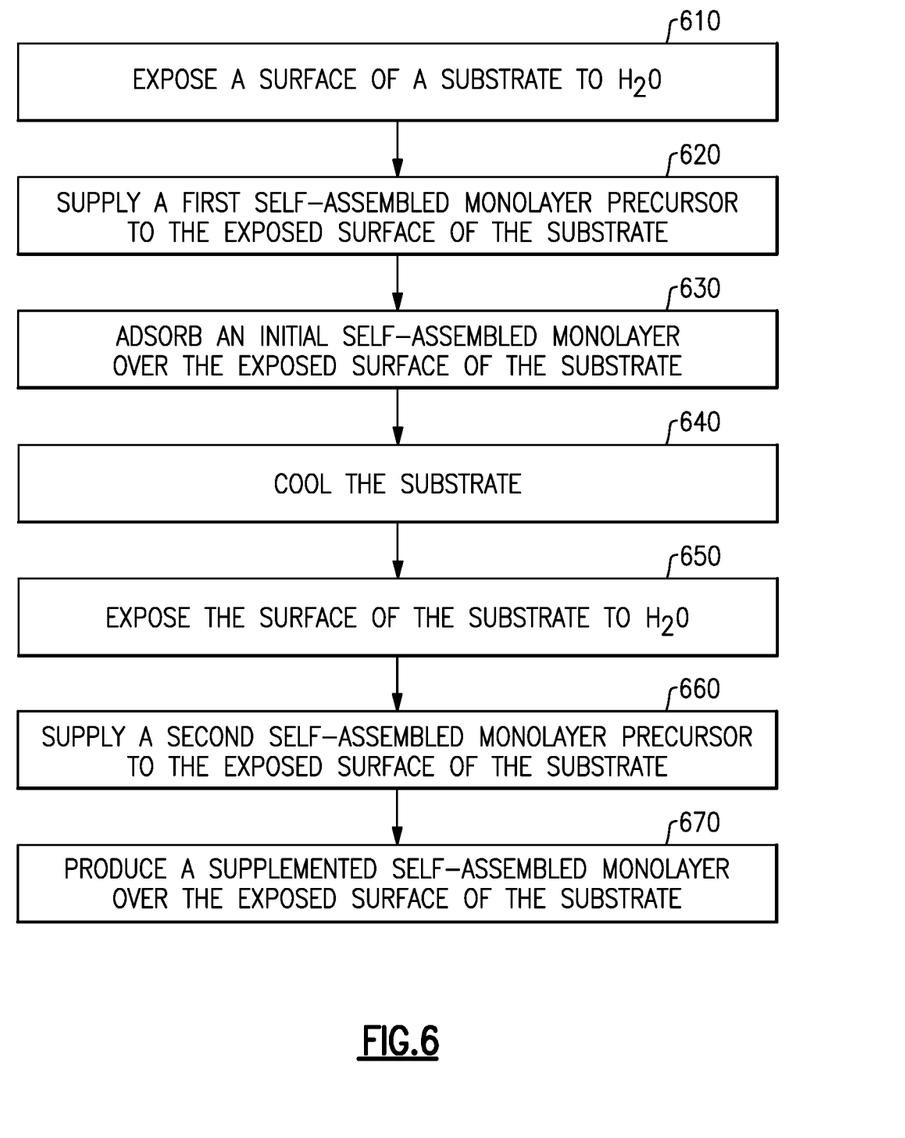
FIG. 6 is a flow chart of a process for preparing a SAM on an exposed surface of a substrate including exposing a surface of a substrate to H₂O according to some embodiments.

FIG. 6 is a flow chart of a process for preparing a SAM on an exposed surface of a substrate including exposing a surface of a substrate to $H_2O$ according to some embodiments. The process comprises exposing 610 a surface of a substrate to $H_2O$; subsequently supplying 620 a first SAM precursor to the exposed surface of the substrate; thereby adsorbing 630 an initial SAM on the exposed surface of the substrate; subsequently cooling 640 the substrate; exposing 650 the surface of the substrate to $H_2O$; subsequently supplying 660 a second SAM precursor to the exposed surface of the substrate; thereby producing 670 a supplemented SAM on the exposed surface of the substrate. The process described in FIG. 6 is similar to the process described with respect to FIG. 3 except that the surface of the substrate is exposed to $H_2O$ before each supply of SAM precursor. It should be understood that the term "exposed surface" describes the same surface of a substrate as described in FIGS. 3-5 even if the surface is treated with $H_2O$ or any other intervening treatments. In some embodiments, the surface of the substrate is exposed to $H_2O$ before supplying the first SAM precursor, but the surface of the substrate is not exposed to $H_2O$ before supplying the second SAM precursor. In other embodiments, the surface of the substrate is exposed to $H_2O$ before supplying the second SAM precursor, but the surface of the substrate is not exposed to $H_2O$ before supplying the first SAM monolayer precursor. As noted above, the first and second SAM precursors can have the same composition. Cooling can be conducted within the deposition chamber or outside (e.g., within the load-lock chamber, in the transfer chamber or in another process chamber). In some embodiments, the surface of the substrate is exposed to $H_2O$ for about 0.1 seconds to about 10 seconds. In other embodiments, the surface of the substrate is exposed to $H_2O$ for about 0.25 seconds to about 5 seconds. In experiments described below, the surface of the substrate is exposed to $H_2O$ for about 1 second.

Figure 7:
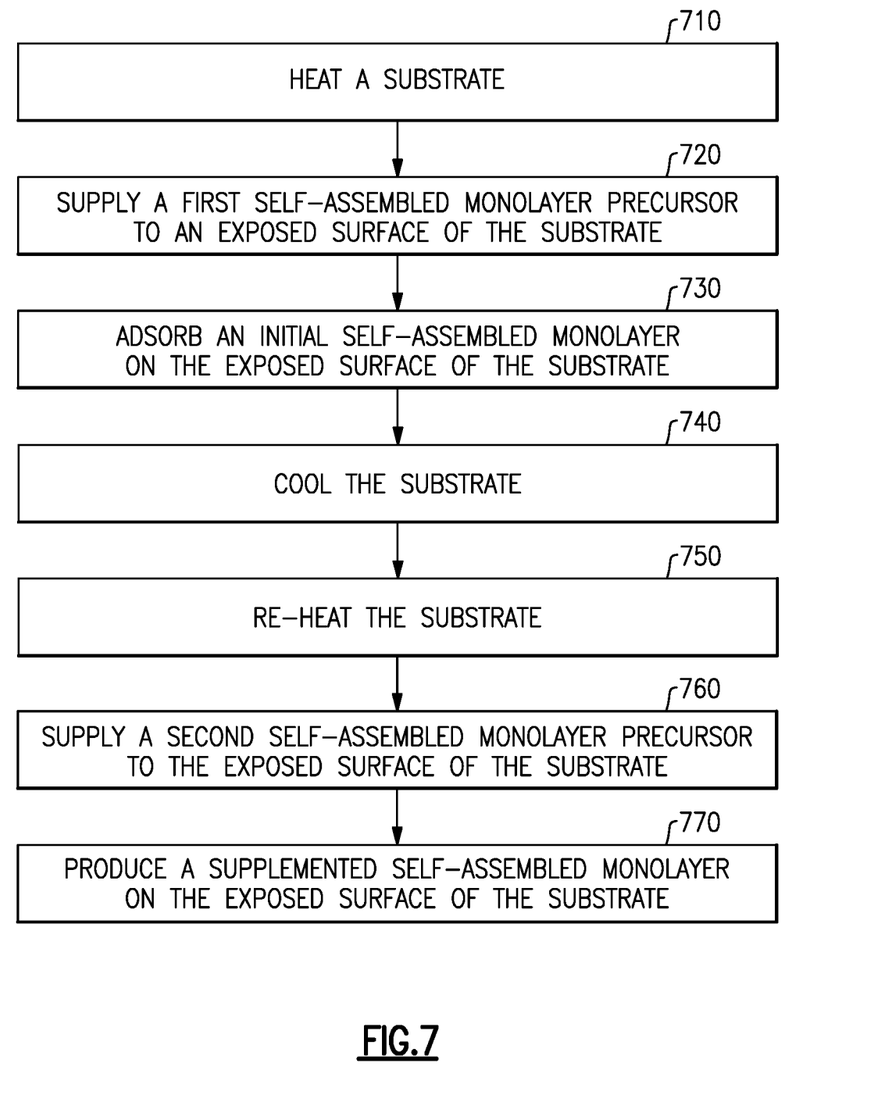
FIG. 7 is a flow chart of a process for preparing a SAM on an exposed surface of a substrate with heating, cooling and re-heating temperature ranges according to some embodiments.

FIG. 7 is a flow chart of a process for preparing a SAM on an exposed surface of a substrate. The process comprises supplying and heating 710 a substrate to a temperature suitable for SAM formation; supplying 720 a first SAM precursor to an exposed surface of the substrate; thereby adsorbing 730 an initial SAM on the exposed surface of the substrate; subsequently cooling 740 the substrate to facilitate subsequent SAM supplementation; re-heating 750 the substrate; subsequently supplying 760 a second SAM precursor to the exposed surface of the substrate; thereby producing 770 a supplemented SAM on the exposed surface of the substrate. The process described in FIG. 7 is similar to the process described with respect to FIG. 3 except that heating and re-heating of the substrate, before and after cooling, are specified. As noted above, the first and second SAM precursors can have the same composition. The temperature ranges for each stage can be as noted above. In some embodiments, the substrate is heated using a susceptor in the process chamber. The susceptor and substrate can be heated radiantly, resistively or inductively. Methods of cooling the substrate may as described above, that is, within the deposition chamber or outside (e.g., within the load-lock chamber, in the transfer chamber or in another process chamber).

Deposition

In some embodiments, following SAM formation as described above, material(s), such as metallic materials (e.g., elemental metal, metal oxide, metal nitride, metal alloys, etc.), is/are selectively deposited on a second surface relative to a first surface by a vapor deposition process, where the first surface comprises a SAM formed by processes described herein. In some embodiments, the first surface is an insulating surface. In other embodiment, the first surface is a conductive surface. In some embodiments, the first surface is a surface of an integrated circuit structure, such as on a semiconductor substrate. In some embodiments the reactants include a first hydrophobic reactant and a second reactant. The first hydrophobic reactant and second reactant can be selected to deposit the desired material. Additional reactants (third reactant, fourth reactant etc. . . . ) can be utilized in some embodiments, for example to contribute additional components to the material that is deposited. In some embodiments the second surface is substantially reactive to one or more of the vapor phase reactants, while the first surface is not substantially reactive.

In some embodiments the vapor deposition process is an ALD-type process in which at least one reactant adsorbs largely intact in a self-limiting process. In some embodiments the deposition process may be a vapor deposition process in which at least one of the reactants is at least partially decomposed, such as selectively decomposed on the first surface. For example, in some embodiments the vapor deposition process may be a chemical vapor deposition (CVD) process, such as a sequential or cyclic CVD process or a single source CVD process.

Figure 8:
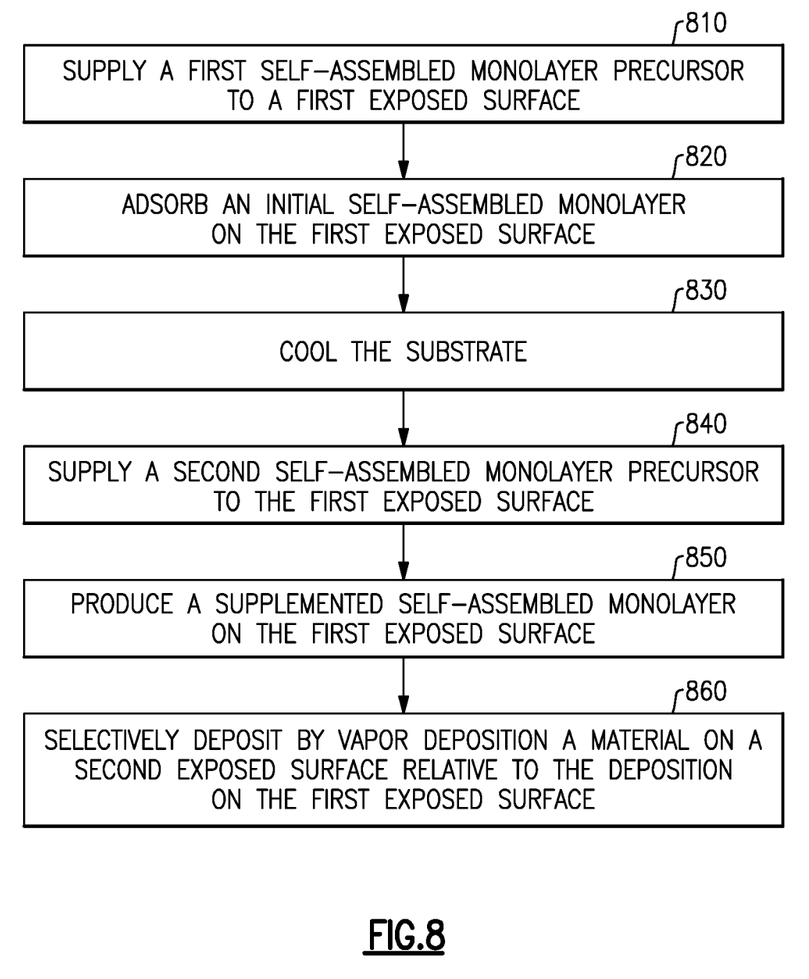
FIG. 8 is a flow chart of a process for preparing a SAM on a first exposed surface and subsequently selectively depositing a material by vapor deposition on a second exposed surface according to some embodiments.

FIG. 8 is a flow chart of a process for preparing a SAM on a first exposed surface and subsequently selectively depositing a material by vapor deposition on a second exposed surface. The process comprises supplying 810 a first SAM precursor to a first exposed surface; thereby adsorbing 820 an initial SAM on the first exposed surface; subsequently cooling 830 the substrate; subsequently supplying 840 a second SAM precursor to the first exposed surface; thereby producing 850 a supplemented SAM on the first exposed surface; and subsequently selectively depositing 860 by vapor deposition a material on a second exposed surface relative to the deposition on the first exposed surface with its supplemented SAM thereon. The process described in FIG. 8 is similar to the process described with respect to FIG. 3 except for specifying that a material is subsequently selectively deposited on a second surface relative to the deposition on the first exposed surface. Methods of selective deposition on a variety of exposed surfaces may be similar to those described above. The selective deposition 860 may be conducted in the same or a different deposition chamber from the chamber(s) in which SAM is supplied 810/840. For example, with reference to FIG. 2, SAM formation using first and second SAM exposures may take place in the first process chamber 202a while selective deposition is performed in the second process chamber 202b. In another example, initial SAM formation using a first SAM exposure may take place in the first process chamber 202a while supplemented SAM formation using a second SAM exposure may take place in the second process chamber 202b, and selective deposition is performed in a third process chamber.

Selectivity

The SAM formation described herein may be selective. For example, the SAM may naturally adsorb on some types of surfaces and not adsorb on other, chemically or morphologically different surfaces. Furthermore, the subsequent deposition may be selective, as described above with respect to selective deposition 860 in FIG. 8.

In some embodiments, a material is selectively deposited on a second substrate surface relative to a different, first surface. Selectivity can be given as a percentage calculated by [(deposition on second surface)−(deposition on first surface)]/(deposition on the second surface). Deposition can be measured in any of a variety of ways. In some embodiments, deposition may be given as the measured thickness of the deposited material. In some embodiments, deposition may be given as the measured amount of material deposited.

In some embodiments, selectivity is greater than about 10%, greater than about 50%, greater than about 75%, greater than about 85%, greater than about 90%, greater than about 93%, greater than about 95%, greater than about 98%, greater than about 99% or even greater than about 99.5%. In embodiments described herein, the selectivity can change over the duration or thickness of a deposition.

In some embodiments deposition on the second surface of the substrate relative to the first surface of the substrate is at least about 80% selective, which may be selective enough for some particular applications. In some embodiments the deposition on the second surface of the substrate relative to the second surface of the substrate is at least about 50% selective, which may be selective enough for some particular applications. In some embodiments the deposition on the second surface of the substrate relative to the first surface of the substrate is at least about 10% selective, which may be selective enough for some particular applications. As is known in the art, partially selective deposition can be followed by a short etch, which may remove all of the deposited material from the unfavored first surface, while leaving some of the deposited material on the favored second surface.

In some embodiments, deposition occurs favorably on the second surface, such as a metallic surface, a metallic surface comprising oxygen or a dielectric surface, and is not favored on the first surface, such as an organic surface (e.g., the SAM described herein). In some embodiments, the first and second surfaces may be surfaces of the same substrate (e.g., surfaces of the same wafer or process chamber). In other embodiments, the first and second surfaces may be surfaces of the different substrates (e.g., the surface of a wafer and the surface of a process chamber, or vice versa).

EXPERIMENTS

Examples 1-10 were performed using Octadecyl(tris(dimethyl)amino)silane $CH_3(CH_2)_{17}Si(N(CH_3)_2)_3$ as a SAM precursor both before and after cooling. "1 cycle" means 5 seconds of a SAM precursor pulse followed by a 5 minute soak. "1 cycle with $H_2O$" means 1 second of an $H_2O$ pulse followed by 5 seconds of a SAM precursor pulse followed by a 5 minute soak. The SAM was prepared with a substrate temperature of 195° C., a vapor source temperature of 195°

C., and a precursor flow rate of 800 sccm. The water contact angles (WCA) of the resulting SAMs were measured.

TABLE 1

| | SAM | | | |
| --- | --- | --- | --- | --- |
| | Step 1 | Step 2 | Step 3 | WCA [°] |
| Example 1 | 1 cycle | | | Max 107° |
| Example 2 | 2-4 cycle | | | Max 108° |
| Example 3 | 1-4 cycles with H2O pulse | | | Max 108° |
| Example 4 | 1 cycle | Air break 30 min or more | 1 cycle | 111° |
| Example 5 | H2O pulse 1 s + 1 cycle | Air break 30 min or more | H2O pulse 1 s + 1 cycle | 111° |
| Example 6 | 1 cycle | Load lock 30 min | 1 cycle | Max 107° |
| Example 7 | H2O pulse 1 s + 1 cycle | Load lock 30 min | H2O pulse 1 s + 1 cycle | Max 107° |
| Example 8 | H2O pulse 1 s + 1 cycle | Load lock over night | H2O pulse 1 s + 1 cycle | 110° |
| Example 9 | 1 cycle | 30 min wait in a reactor | 1 cycle | Max 107° |
| Example 10 | 1 cycles | 60 min wait in reactor | 1 cycle | Max 107° |

As it can be seen, the number of cycles of SAM precursor and the supply or non-supply of $H_2O$ have little effect on the WCA if there is no cooling. On the other hand, cooling can have a significant effect on WCA. In the chart above, "air break" represents a cooling step because the substrate was removed from the hot susceptor to an environment where it could readily cool. Removing the substrate to a load lock for 30 minutes may not have resulted in significant cooling due to the low pressures maintained in the load lock slowing the rate of cooling, whereas leaving the substrate in the load lock overnight cooled the substrate sufficiently to result in a high WCA.

It will be apparent to those skilled in the art that various modifications and variations can be made in the present invention without departing from the scope or spirit of the invention. Thus, it is intended that the present invention cover the modifications and variations of this invention provided that they come within the scope of the appended claims or their equivalents.

What is claimed is:

1. An apparatus for depositing a self-assembled monolayer (SAM) on a substrate, the apparatus comprising:
   at least one SAM source configured to supply at least one SAM precursor vapor;
   a reaction chamber configured to accommodate a substrate on a susceptor and in fluid communication with the at least one SAM source, the substrate comprising a first surface and a second surface;
   a cooling station configured to accommodate the substrate; and
   a control system configured to cause the apparatus to:
      while the substrate is in the reaction chamber, deposit a SAM over the first surface of the substrate by communicating a first SAM precursor vapor from the at least one SAM source;
      transfer the substrate to the cooling station for cooling the substrate after depositing the SAM over the first surface of the substrate; and
      selectively deposit a material on the second surface of the substrate by vapor deposition.

2. The apparatus of claim 1, wherein the cooling station is outside the reaction chamber.

3. The apparatus of claim 1, further comprising a transfer chamber and a load-lock chamber, wherein the cooling station is in the transfer chamber.

4. The apparatus of claim 1, further comprising a transfer chamber and a load-lock chamber, wherein the cooling station is in the load-lock chamber.

5. The apparatus of claim 1, wherein the cooling station is configured to hold more than one substrate.

6. The apparatus of claim 1, wherein the cooling station is configured to cause the apparatus to actively cool the substrate.

7. The apparatus of claim 1, wherein the cooling station is configured to cool the substrate to a temperature between about 0° C. and about −200° C.

8. The apparatus of claim 1, wherein the material comprises a metal.

9. The apparatus of claim 8, wherein the material comprises an elemental metal.

10. The apparatus of claim 8, wherein the material comprises at least one of a metal oxide or a metal nitride.

11. The apparatus of claim 8, wherein the material comprises a metal alloy.

12. The apparatus of claim 1, further comprising a second reaction chamber, wherein the material is selectively deposited on the second surface of the substrate in the second reaction chamber.

13. The apparatus of claim 1, wherein the material is selectively deposited in the reaction chamber.

14. A method of self-assembled monolayer (SAM) formation and selective deposition, the method comprising:
   supplying a SAM precursor vapor to adsorb a SAM over a first surface of a substrate;
   cooling the substrate with the SAM over the first surface of the substrate; and
   after said cooling, selectively depositing a material comprising a metal on a second surface of the substrate relative to the SAM over the first surface of the substrate.

15. The method of claim 14, wherein the material comprises an elemental metal.

16. The method of claim 14, wherein the material comprises a metal oxide or a metal nitride.

17. The method of claim 14, wherein the material comprises a metal alloy.

18. The method of claim 14, wherein said cooling is performed by a cooling station in a transfer chamber.

19. The method of claim 14, wherein said cooling is performed by a cooling station in a load-lock chamber.

20. The method of claim 14, wherein said cooling comprises convectively cooling the substrate.

* * * * *